United States Patent
Cote et al.

(10) Patent No.: US 6,483,172 B1
(45) Date of Patent: Nov. 19, 2002

(54) SEMICONDUCTOR DEVICE STRUCTURE WITH HYDROGEN-RICH LAYER FOR FACILITATING PASSIVATION OF SURFACE STATES

(75) Inventors: Donna Rizzone Cote; William Joseph Cote, both of Poughkeepsie, NY (US); Son Van Nguyen, Los Gatos, CA (US); Markus Kirchhoff, Ottendorf-Okrilla (DE); Max G. Levy, Essex Junction, VT (US); Manfred Hauf, Wappingers Falls, NY (US)

(73) Assignees: Siemens Aktiengesellschaft, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/562,217

(22) Filed: Apr. 28, 2000

Related U.S. Application Data

(62) Division of application No. 09/037,290, filed on Mar. 9, 1998.

(51) Int. Cl.$^7$ ............................................. H01L 23/58
(52) U.S. Cl. ........................ 257/639; 257/640; 257/760
(58) Field of Search ................................. 257/639, 640, 257/649, 760, 750; 438/778, 786, 791

(56) References Cited

U.S. PATENT DOCUMENTS

| | | | | |
|---|---|---|---|---|
| 4,436,770 A | * | 3/1984 | Nishizawa et al. | 438/784 |
| 4,717,631 A | * | 1/1988 | Kaganowicz et al. | 257/634 |
| 4,980,307 A | * | 12/1990 | Ito et al. | 438/777 |
| 5,563,102 A | * | 10/1996 | Michael | 438/763 |
| 5,624,864 A | * | 4/1997 | Arita et al. | 438/763 |
| 5,946,585 A | * | 8/1999 | Zhang et al. | 438/475 |
| 6,037,273 A | * | 3/2000 | Gronet et al. | 438/773 |
| 6,172,411 B1 | * | 1/2001 | Chao et al. | 257/639 |

* cited by examiner

Primary Examiner—Kevin M. Picardat
(74) Attorney, Agent, or Firm—Stanton Braden

(57) ABSTRACT

A process for fabricating a device including the step of forming a structure for facilitating the passivation of surface states is disclosed. The structure comprises an oxynitride layer formed as part of the device structure. The oxynitride facilitates the passivation of surface states when heated.

11 Claims, 6 Drawing Sheets

US 6,483,172 B1

SEMICONDUCTOR DEVICE STRUCTURE WITH HYDROGEN-RICH LAYER FOR FACILITATING PASSIVATION OF SURFACE STATES

This is a divisional, of application Ser. No. 09/037,290 filed Mar. 9, 1998.

FIELD OF INVENTION

The invention generally relates to devices and device fabrication and, in particular, to devices having a layer for facilitating passivation of surface states and a process for fabricating such devices.

BACKGROUND OF INVENTION

In device fabrication, insulating, semiconducting, and conducting layers are produced and patterned on a substrate to form device structures, such as transistors, capacitors, or resistors. These device structures are then interconnected to achieve a desired electrical function. The production and patterning of the various device layers are achieved using conventional fabrication techniques such as, for example, oxidation, implantation, deposition, epitaxial growth of silicon, lithography and etching. Such techniques are described in S. M. Sze, "*VLSI Technology*", 2nd ed., New York, McGraw-Hill, 1988, which is herein incorporated by reference for all purposes.

Conventional fabrication techniques induce various forms of defect or damage to the layers within the device. For example, damage to chemical bonds at the semiconductor interfaces creates dangling bonds known as surface or interface states. Surface states promote recombination of electron-hole pairs. Recombination is a phenomenon whereby electron-hole pairs are annihilated or destroyed. Recombination, particularly if it occurs at critical device interfaces such as isolation perimeters and gate oxides, results in leakage current. Leakage current alters the gate threshold voltage, data retention, and standby power consumption of devices. Thus, the presence of interface states adversely affects device functions.

Surface states are repaired by providing hydrogen atoms to passivate the dangling bonds. Conventionally, relatively high temperature anneals, typically about 400 to 600° C., in hydrogen-containing ambients have been employed to supply hydrogen to passivate the dangling bonds. The passivation anneal is usually performed late in the device fabrication processing sequence, such as after the formation of the various layers, including the metallization or interconnection layer. This reduces the number of passivation anneals required to repair the dangling bonds created during previous fabrication processes. Reduction in the number of passivation anneals reduces process costs.

However, current interconnection schemes and device structures tend to inhibit the ability of the hydrogen atoms from reaching the recombination sites to passivate the dangling bonds. As such, the effectiveness and efficiency of the passivation anneal is reduced. For instance, silicon nitride deposited by low pressure chemical vapor deposition (LPCVD), which serves as a mobile ion and transition metal diffusion barrier, blocks the diffusion of hydrogen. This LPCVD silicon nitride film prevents hydrogen from penetrating to the layers below to passivate the surface states existing in those layers. In tungsten stud structures, the tungsten quenches the hydrogen, producing a similar effect as the silicon nitride layer. The efficiency of passivation anneals is further reduced since nitrogen gas is often used to dilute the hydrogen (forming gas) in order to decrease the inherent danger associated with the explosive nature of hydrogen.

From the above discussion, it is apparent that there is a need to effectively passivate the surface states caused by device fabrication techniques.

SUMMARY OF THE INVENTION

The invention is generally related to device fabrication. As known in the art, conventional device fabrication techniques damage chemical bonds, creating surface states at semiconductor interfaces. These surface states are repaired or passivated by supplying hydrogen atoms during a hydrogen anneal. However, current device structures tend to block hydrogen from reaching and passivating the surface states.

To overcome the passivation problem that exists with current device structures, a process for fabricating a device is disclosed. The process includes the step of fabricating a device structure which facilitates the passivation of surface states. The device structure comprises an oxynitride layer. In one embodiment, the oxynitride layer is formed by plasma-enhanced chemical vapor deposition (PECVD).

DETAILED DESCRIPTION OF THE INVENTION

The present invention relates to the passivation of surface states created during device fabrication. For purposes of illustration, the invention will be described in the context of a dynamic random access memory (DRAM) cell. However, the invention is significantly broader and extends to the fabrication of devices in general, such as bipolar devices, BiCMOS, thin film transistors, heterojunction devices, and the like.

Figure 1:
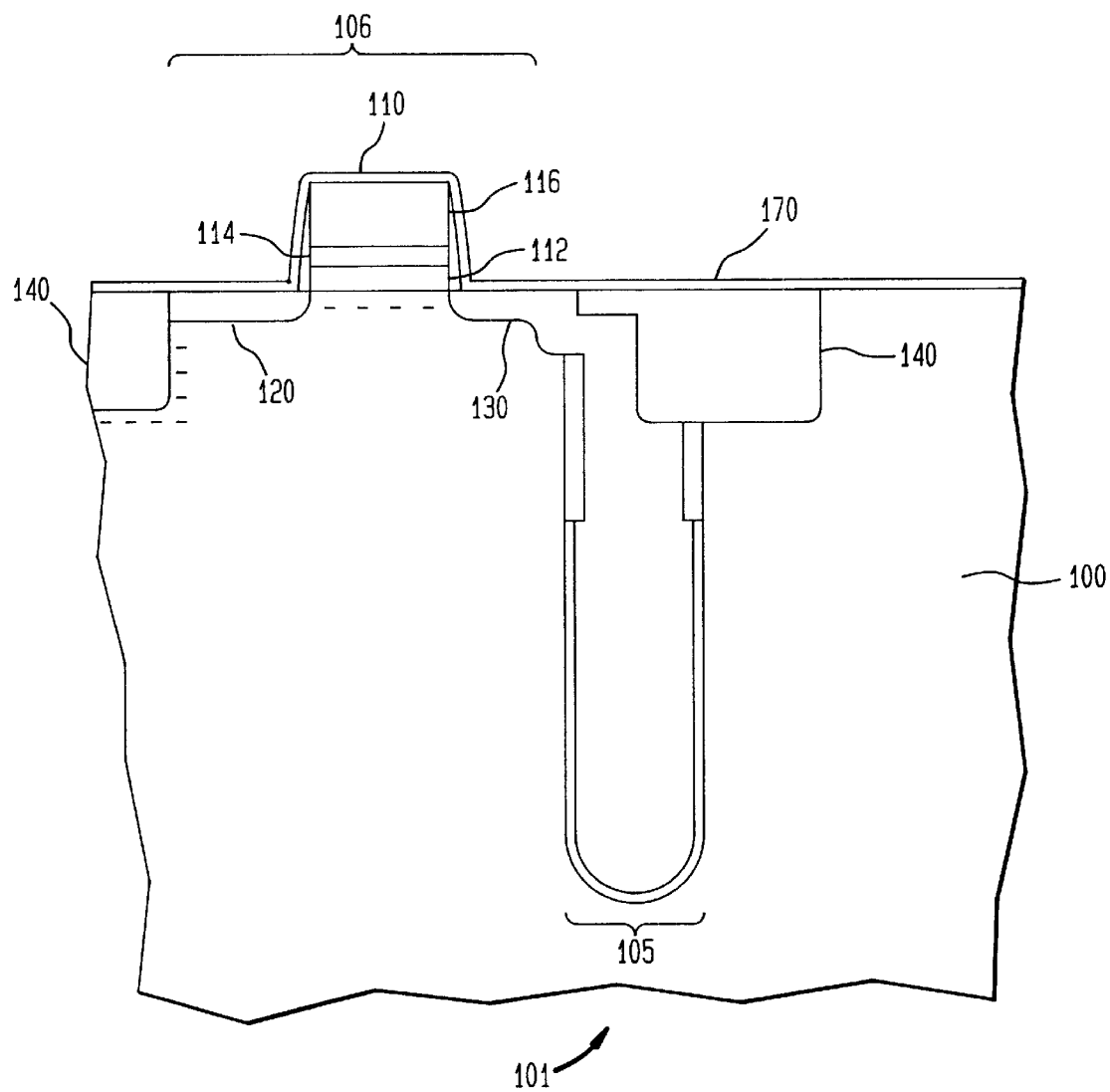
FIG. 1 depicts a simplified device structure of a conventional transistor with isolation.

In FIG. 1, a DRAM cell 101 formed on a substrate 100, such as a semiconductor wafer, is shown. The wafer, for example, comprises silicon formed by the Czochralski technique. The major surface of the wafer is not critical, and any suitable orientation such as an <100>, <110>, or <111> is useful. Typically, the wafer has a <100> orientation because such a wafer is commonly available due to its low surface states and high carrier mobility. Other semiconductor wafers, such as germanium, gallium arsenide, and group III-V compounds are also useful. Additionally, wafers that comprise a plurality of layers of material are also useful.

These substrates, for example, include one type of single crystalline material formed on top of another type of single crystalline material (e.g., silicon on sapphire (SOS)), or amorphous or polycrystalline material recrystallized on a layer of amorphous material (e.g., silicon on insulator (SOI)). It is possible to heavily or lightly dope the substrate with impurity atoms, such as boron (B), phosphorus (P), arsenic (As), or antimony (Sb), to achieve the desired electrical characteristics.

As shown, the DRAM cell comprises a capacitor 105 for storage of electrical charge representative to a bit of data. In the illustrative embodiment, the capacitor is a trench capacitor formed in the substrate. Other types of capacitor, such as stack capacitors are also useful for storage of charge. A transistor 106, which includes a gate 110, source 120, and drain 130, is electrically connected to the capacitor. A shallow trench isolation STI regions 140 is provide to isolate the DRAM cell from other cells or devices within the array.

A plurality of memory cells are arranged in rows and columns to form a DRAM array. The rows are referred to as word lines and columns are referred to bit lines. Generally, the source 120 is connected to a bit line and the gate 110 is connected or represents the word line of a DRAM array. By applying the appropriate voltages to the bit line and word line, the transistor is switched on to allow access to the capacitor.

The gate region of the transistor typically comprises a polycrystalline (poly) layer 112 formed over a gate oxide 111. In some applications, a layer of silicide 114 is used to form a composite gate stack. Various silicides, including molybdenum ($MoSi_x$), tantalum ($TaSi_x$), tungsten ($WSi_x$), titanium silicide ($TiSi_x$) or cobalt silicide ($CoSi_x$), are used to form layer 114. Alternatively, aluminum or refractory metals, such as tungsten and molybdenum, are used alone or in combination with silicides or poly. Composite gates are desirable as their use reduces the sheet resistance of the gate region, thereby decreasing the R-C delay of signals that are routed along it.

A nitride cap 116 is deposited over the gate by low pressure chemical vapor deposition (LPCVD). The cap serves as an etch stop for subsequent process steps, such as forming the borderless bit line contact to the source. A spacer 160 is deposited over the gate to define the underlap diffusion of the source and drain regions into the gate region, which reduces overlap capacitance. After spacer formation, a nitride layer 170 is deposited on the side of the gate and over the source, drain, and STI regions to provide a mobile ion barrier and also to serve as an etch stop. A dielectric layer (not shown) is formed over the device structure to provide insulation between the conducting layers (except where contact is desired) or to act as a protective layer to insulate the device structure from impurities, moisture, and scratches. The dielectric layer, for example, includes phosphorus-doped silicon dioxide such as phosphosilicate glass (PSG) or borophosphosilicate glass (BPSG).

Of course, the device structure, as described in FIG. 1, has been simplified for purposes of illustration. For example, the actual device structure used in a DRAM cell includes other regions, such as wells, contacts and local interconnects. The formation of the various regions of the device structure is well-known and described in, for example, Kenney et al., *A Buried Plate Trench Cell For a 64M DRAM*, VLSI Tech. Dig. (1992), which is herein incorporated by reference for all purposes.

Surface states created during the fabrication of the various layers of the device structure are depicted by "−" signs. Typically, as shown, the surface states are located at the gate oxide and STI perimeters. These surfaces states need to be passivated. Typically, a hydrogen anneal is employed to passivate the surface states. During the anneal, hydrogen atoms from the ambient pass through the gate to the bulk of the structure. However, most current device structures are capped with a LPCVD silicon nitride layer. As discussed above, the nitride layer prevents hydrogen atoms from passing through it to passivate the surface states.

To overcome the problems created by the use of conventional LPCVD nitride layers, a passivation structure is provided to facilitate the repair of surface states created during fabrication. This passivation structure comprises a hydrogen-rich (H-R) silicon nitride layer incorporated into the device. As known in the art, a conventional LPCVD silicon nitride layer comprises about 3–5% hydrogen atoms (all compositional percentages in this disclosure are by atomic %). See Habraken et al., *Silicon Nitride and Oxynitride Films*, Mat. Sci. and Eng., R12 No. 3 (July 1994) and Chow et al., *Hydrogen Content of a Variety of Plasma-Deposited Silicon Nitrides*, J. Appl. Phys., Vol. 53, No. 8 (August 1982), both herein incorporated by references for all purposes. "Hydrogen-rich," as used herein, refers to a percentage of hydrogen greater than that used in conventional LPCVD silicon nitride layers. Experiments have shown that the use of a H-R silicon nitride layer decreases junction leakage currents, indicating successful passivation of surface states.

The exact mechanism of how the H-R silicon nitride layer facilitates the passivation of surface states is not known. However, it is believed that H-R nitride layer acts either as a source of hydrogen atoms or as a structure which allows hydrogen to pass through, or a combination of both. Logically, the increased percentage of hydrogen increases the amount of hydrogen atoms in the H-R silicon nitride layer, thereby creating a source from which hydrogen atoms diffuse to passivate the surface states. Furthermore, as the percentage of hydrogen increases, the density of the nitride layer decreases. The decrease in density allows hydrogen atoms to sufficiently penetrate the nitride layer and into the device structure for surface state passivation.

Figure 2:
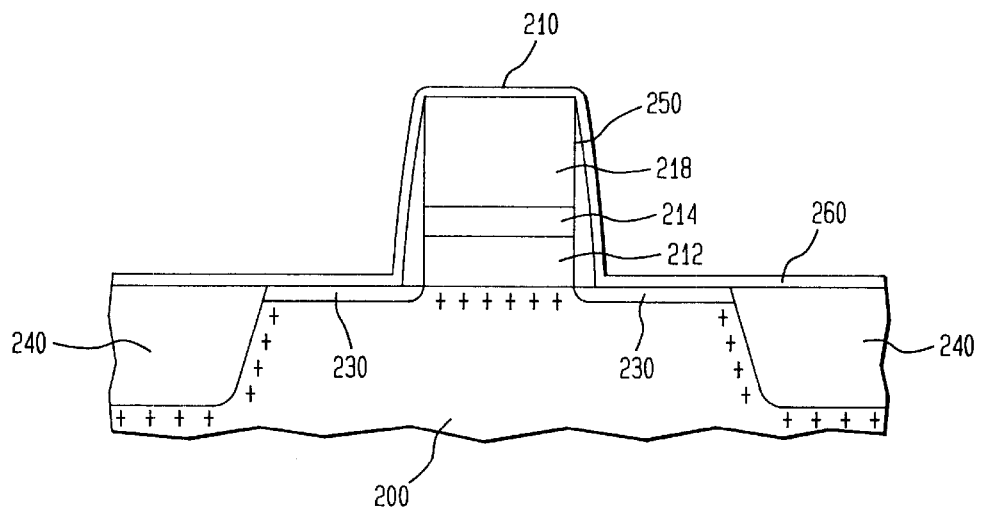
FIG. 2 depicts a simplified device structure of a transistor with a passivation layer.

FIG. 2 shows a simplified device structure 200 used, for example, in a DRAM cell having a H-R silicon, layer. As shown, the H-R silicon nitride layer is incorporated into the device structure as a barrier or liner layer 260 at the device interconnection interface. Device structure 200 comprises a gate 210, a drain 220, a source 230, and STI regions 240. Gate 210 includes a poly layer 212, silicide layer 214 such as $WSi_x$, and a silicon nitride cap layer 218. Also, the device structure includes spacer layer 250. The drain, source, gate, STI regions, and spacer are formed using conventional techniques.

Next, the H-R layer 260 is formed on the device structure. Formation of the H-R layer is achieved using conventional plasma enhanced chemical vapor deposition (PECVD) techniques. Such PECVD techniques are described in Gupta et al., The *Preparation, Properties and Application of Silicon Nitride Thin Films Deposited By Plasma-Enhanced Chemical Vapor Deposition*, Thin Solid Films, 204 (1991), which is herein incorporated by reference for all purposes. The temperature at which PECVD is performed is typically between about 300–500° C. Electron-Cyclotron-Resonance Chemical Vapor Deposition (ECRCVD) techniques are also useful for forming the H-R layer. ECRCVD Techniques are described in Kotecki et al., *Hydrogen Incorporated In Silicon Nitride Films Deposited By Remote Electron-Cyclotron-Resonance Chemical Vapor Deposition*, J. Appl. Phys. 77(3) (Feb. 1, 1995), also herein incorporated by reference for all purposes.

The H-R layer comprises a percentage of hydrogen greater than conventional LPCVD silicon nitride. In one embodiment, the percentage of hydrogen is greater than about 5% and less than or equal to about 39%. Percentages of hydrogen exceeding about 39% typically degrade the properties of the silicon nitride film, such as its ability to act as a barrier. Preferably, the percentage of hydrogen is between about 10–35%, more preferably between about 10–25%, even more preferably about 12–25%, and most preferably 15–20%.

As previously discussed, PECVD of the H-R layer is typically performed at a temperature between about 300–500° C. Forming the H-R layer at such a relatively low temperature is advantageous. For example, hydrogen atoms from the H-R layer diffuse throughout the device structure during subsequent processes which are performed at a temperature higher than the PECVD temperature. The subsequent higher temperature processes, in some instances, are sufficient to passivate the surface states without the need for a passivation anneal. The passivated surface states are depicted with "+" signs.

A passivation anneal may be employed to passivate the surface states. Typically, conventional passivation anneals are performed at a temperature of about 400° C. for about 30–60 minutes in a hydrogen or hydrogen/nitrogen (forming gas) ambient. However, the use of an H-R layer provides an insitu source of hydrogen, thus reducing or eliminating the need for hydrogen containing anneals to effectively passivate the surface states.

Figure 3:
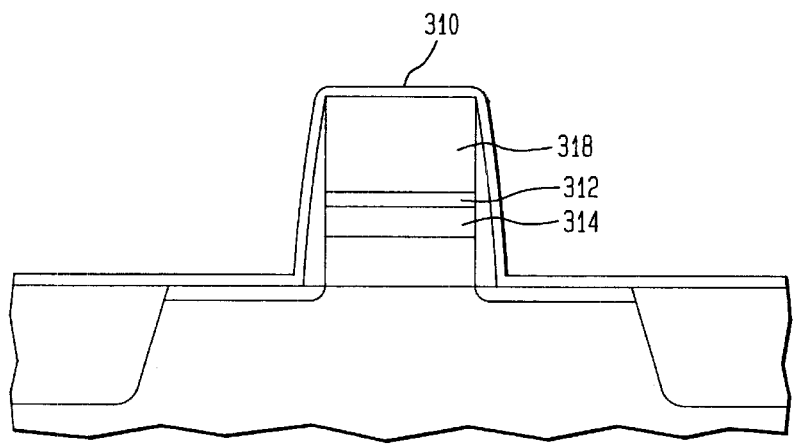
FIG. 3 depicts a simplified device structure of a transistor with a passivation layer as part of the composite gate.

Referring to FIG. 3, an H-R layer 315 is formed as part of the gate structure to passivate the surface states. As shown, the H-R layer 315 is formed between the silicide layer 314 and silicon nitride cap layer 318 of the composite gate 310. H-R layer 315 can be used alone or in conjunction with the H-R layer 260 as described in FIG. 2. Additional H-R layer or layers may be formed within the device to enhance the passivation of surface states.

In applications where the H-R silicon nitride layer is deposited over a tungsten layer, such as a tungsten stud structure or a tungsten silicide composite gate, an adhesion promoting layer may be required. The adhesion promoting layer may be necessary because nitrides generally do not adhere well to tungsten. To improve adhesion between tungsten and nitrides, a thin silicon layer is formed over the tungsten prior to the deposition of the H-R layer.

In another embodiment, oxynitride is used instead of a H-R silicon nitride to serve as the passivation structure, such as the barrier layer. The oxynitride is deposited by, for example, plasma-enhanced chemical vapor deposition (PECVD). Deposition of oxynitride by PECVD is described in, for example, Habraken and Kuiper, "Silicon Nitride and Oxynitride Films", Material Science and Engineering, R12 No. 3, July 1994, pp. 123–175, which is herein incorporated by reference for all purposes. Precursors, such as silane ($SiH_4$), ammonia ($NH_3$) and/or nitrogen ($N_2$), and nitrous oxide ($N_2O$), are introduced into a reactor to form the oxynitride layer. The oxynitride is deposited, for example, at a power of about 300–1000 W, pressure of about 2–10 Torr, temperature of about 300–500° C. Preferably, the oxynitride is deposited in a reactor at a power of about 300–800 W, pressure of about 2–6 Torr, temperature of about 350–480° C.

In one embodiment, PECVD is performed in a single/wafer tool such as an AME 5000 manufactured by Applied Materials, Inc. or a multi-station wafer tool such as the Novellus Concept-1 manufactured by Novellus Systems, Inc. Typical process conditions for the single and multi-station wafer tool systems are shown in Table 1. Of course these parameters may be optimized for specific tools or processes.

TABLE 1

Experiments

Single Wafer Tool Process Conditions

2% silane in $N_2$ flow: 3000 sccm
$NH_3$ flow: 15 sccm
$N_2O$ flow: 10–40 sccm (will change oxygen content)
$N_2$ flow: 1050–1020 sccm
$N_2$ + $N_2O$ total flow constant at 1060 sccm
Power: 340 watts
Temperature: 480° C.
Spacing: 350–380 mils
Pressure: 5.75 torr Multi-Station Tool Process Conditions Silane flow: 0.15 slm
$NH_3$ flow: 1.8 slm
$N_2O$ flow: .2–2 slm (will change oxygen content)
$N_2$ flow: 11.8–10 slm
$N_2$ + $N_2O$ total flow constant at 12 slm
Power: 0.7 kW (HF) and 0.10 kW (LF)
Temperature: 400° C.
Pressure: 2.25 torr Alternatively, the oxynitride is deposited by LPCVD. Typical process conditions for LPCVD oxynitride are shown in Table 2. of course these parameters may be optimized for specific tools or processes.

TABLE 2

Typical process conditions - LPCVD Oxynitride

Dichlorosilane flow: 135 sccm
$NH_3$ Flow: 90 sccm
$N_2$ Flow: 450 sccm
Temperature: 770° C.
Pressure: 250 mtorr After formation of the passivation layer, the device structure may be annealed to passivate the surface states. The anneal, for example, is performed in a hydrogen containing ambient. Alternatively, the anneal may be integrated as part of the subsequent fabrication processes.

Figure 5A:
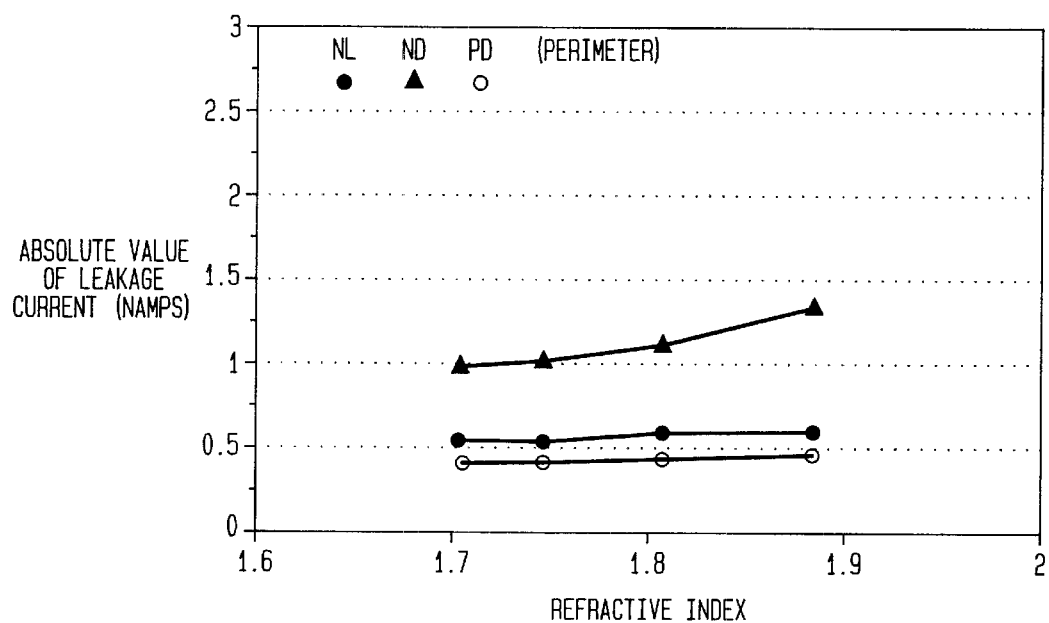
FIG. 5 shows the relationship between refractive index and etch selectivity of oxynitride.
Figure 5B:
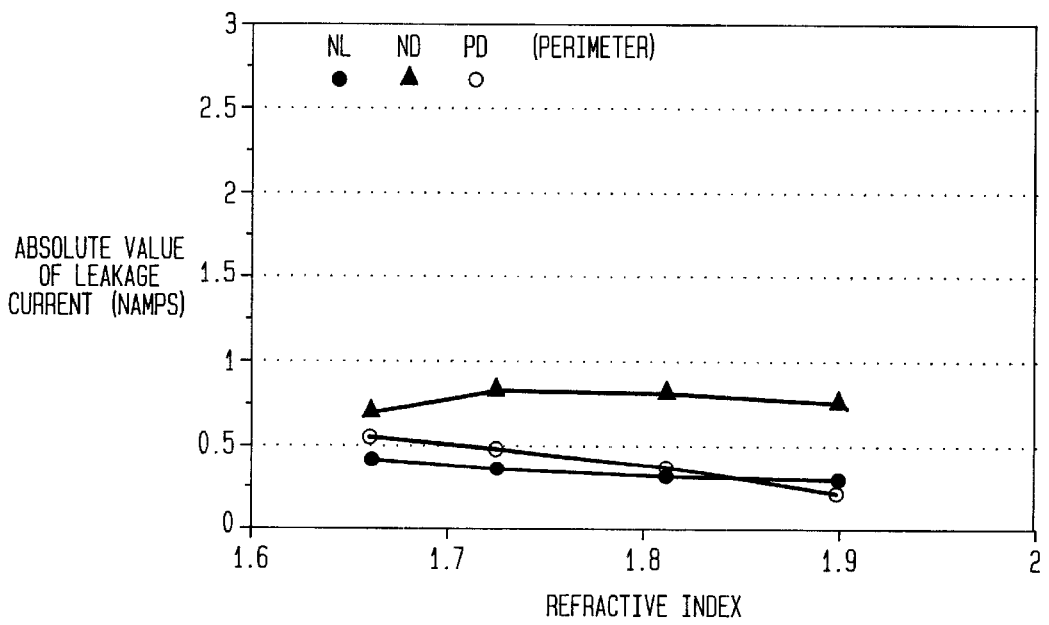

The oxynitride layer, when used as barrier liner, results in very low, reproducible STI bounded junction leakage for both the N and P diffusion. Referring to FIGS. 5a–b, the STI bounded junction leakage (referred to as NL, ND, and PD perimeter leakage) of oxynitride made from single and multi-station wafer tools are plotted against the refractive index. As can be seen, the leakage current is very low, below 1.4 namps for the oxynitride formed in a single station tool and below 0.9 namps for the oxynitride formed in a multi-station tool. Additionally, the use of oxynitride as a barrier passivation layer has produced a more uniform distribution in leakage currents among wafers from the same lot as well as from lot to lot.

Figure 8:
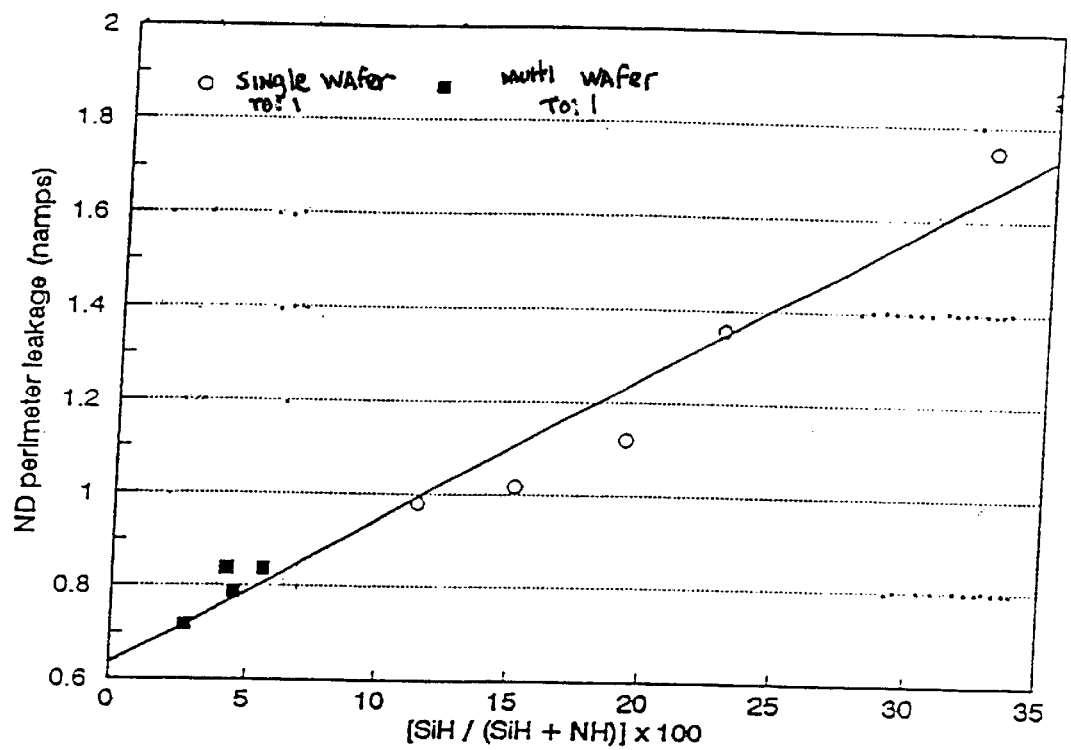
FIG. 8 shows the relationship between the percentage of silicon bounded to hydrogen versus ND perimeter leakage.

It has been discovered, as seen in FIG. 8, that there is a general relationship between the percentage of hydrogen bounded to silicon (SiH or SiH/[SiH+NH]) in the H-R nitride and oxynitride films and junction leakage. It has been found that lower percentages of hydrogen bounded to silicon result in reduced junction leakage while higher percentages result in increased junction leakage. This relationship between the percentage of hydrogen bounded to silicon and junction leakage indicates that lower percentages of SiH or (SiH)/(SiH+NH) improves passivation characteristics of the passivation structure. Lower percentages is believed to cause the passivation structure to be more permeable to hydrogen, thus allowing hydrogen from the ambient to pass through and passivate the surface states. In addition, lower percentage of SiH is believed to make the film low electron trapping, thus improving its leakage characteristic. See Smith; "Controlling the plasma chemistry of silican nitride and oxide deposition from silane", J. Vac. Sci. Tech. All (4) July/August 1993 P1843, which is herein incorporated by reference for all purposes. As a result, the passivation structure produces memory chips with higher and more uniform retention times. In one embodiment, the percentage of SiH is about 0–39%, preferably about 3–20%, and more preferably about 3–8%.

Figure 4:
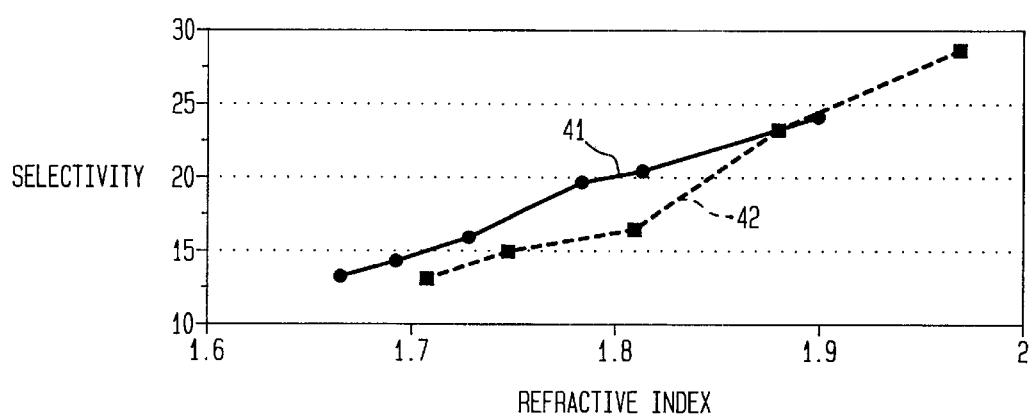
FIGS. 4a–b show the perimeter leakage of oxynitride films made by AME and Novellus tools systems.

In some applications, the barrier layer is used as an etch stop, such as for forming a borderless contact. In such applications, the selectivity or etch rate ratio of the interlevel dielectric, such as borophosphosilicate glass (BPSG) or other types of oxide to oxynitride, should be sufficiently high for the oxynitride film to act as an etch stop. FIG. 4 plots the oxynitride film selectivity to oxides using fluorocarbon chemistry. Line 41 represents oxynitride formed in a multi-station wafer tool and line 42 represents oxynitride formed in a single wafer tool. For the multi-station wafer tool, the oxynitride selectivity ranges from about 13:1 at a refractive index of about 1.66 to about 24:1 at a refractive index of about 1.9. As for the single wafer tool, the oxynitride selectivity ranges from about 13:1 at a refractive index of about 1.71 to about 29:1 at a refractive index of about 1.98. Such selectivity is sufficient for the oxynitride to serve as an etch stop. The actual selectivity chosen for a specific application depends on, for example, design parameters.

An experiment measuring STI bounded junction leakage in ND, PD and NL devices was performed using macros consisting of diffusion serpentines with STI comb perimeter. A 0.2 um space to diffusion was provided and the STI was covered by gate conductor. The diffusion linewidth was about 0.55 um and the GC combs are 2.5 um wide. The serpentine length is about 58400 um length, creating a perimeter length of 116800 um with an area of 32120 um$^2$. FIG. 5a plots the NL, ND, and PD leakage as a function of refractive index for oxynitride formed in a single wafer tool and FIG. 5b plots the NL, ND, and PD leakage as a function of refractive index for oxynitride formed in a multi-station tool. As shown, the leakage of devices with oxynitride formed in a single wafer tool with a refractive index of between 1.7–1.9 is less than 1.5 namp while the leakage of devices with oxynitride formed in a multi-station wafer tool with a refractive index of about 1.66 to 1.9 is less than 1 namp.

EXAMPLES

Example 1

An experiment was conducted to compare leakage currents of devices incorporating the H-R silicon nitride layer against those with conventional silicon nitride layers. Eight lots (samples A–H) with devices fabricated thereon were prepared. The eight lots were processed in 2 different ways. Lots A–D comprise device structures fabricated with a conventional LPCVD silicon nitride layer to serve as a barrier or liner layer at the device interconnection interface. The device structures in lots A–D are similar to those described in FIG. 1. The conventional LPCVD silicon nitride film was deposited by reacting ammonia ($NH_3$) with dichlorosilane ($SiCl_2H_2$) in a furnace at about 720° C. and 200 mTorr. The ratio of the $NH_3$ to $SiCl_2H_2$ is about 10:1. As for Lots E–H, the LPCVD nitride layer is replaced with an H-R silicon nitride layer, such as one described in FIG. 2. The H-R layer is deposited by PECVD in a reactor at about 480° C., 5.75 Torr, and 340 Watts. The process parameters for the reactants are as follows: about 3000 sccm of 2% silane ($SiH_4$) in nitrogen ($N_2$), about 1060 sccm of $N_2$, and about 15 sccm of $NH_3$.

Figure 6:
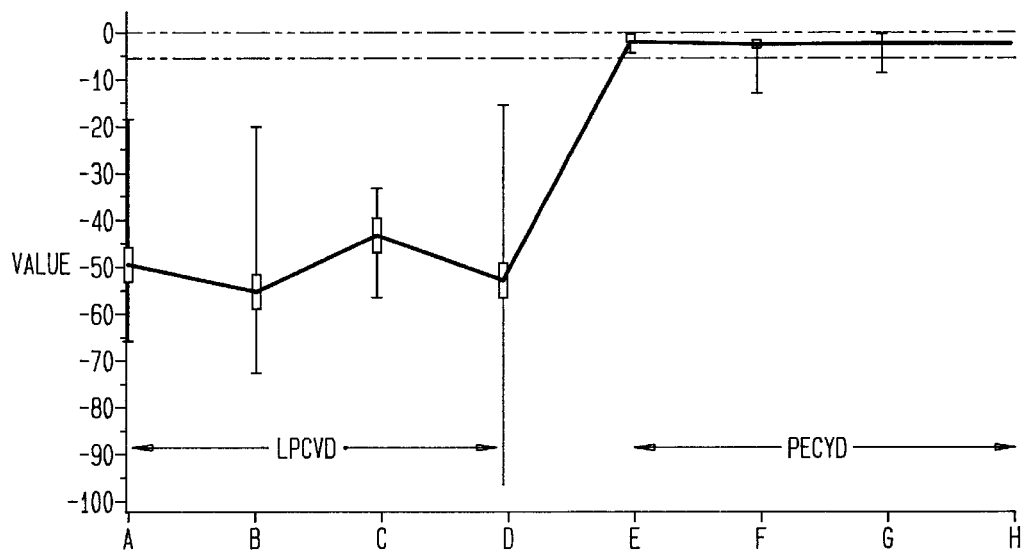
FIG. 6 is a graph comparing leakage current of devices having a conventional nitride film with devices having a hydrogen-rich (H-R) nitride film.

Leakage currents of samples from the two sets of lots were tested using a standard junction leakage test as described in SZE, *Physics of Semiconductor Devices,* Wiley (1969), which is herein incorporated by reference for all purposes. Referring to FIG. 6, the STI bounded junction leakage current test of each lot is shown on an arbitrary scale. Lots A–D represent wafers with LPCVD nitride layer, and lots E–H represent the wafers with PECVD H-R nitride layer. Clearly, the samples with a conventional LPCVD nitride layer show substantially more leakage current than those with the PECVD H-R silicon nitride layer.

Example 2

Figure 7:
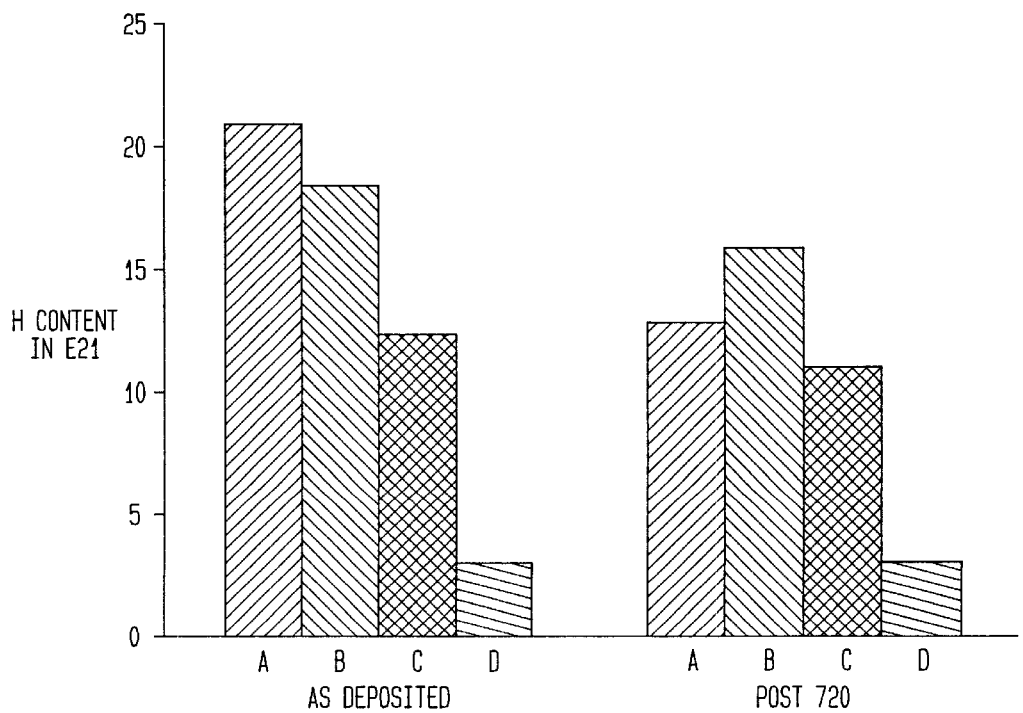
FIG. 7 is a graph comparing the characterization of conventional low pressure chemical vapor deposited nitride film and H-R nitride films.

In FIG. 7, the characterization of PECVD H-R nitride films (samples A–C) was compared against that of an LPCVD nitride film. Sample A is a standard silicon nitride deposited by PECVD in a Novellus Concept-1 System. Sample B is a low SiH/UV PECVD nitride film deposited in a Novellus Concept-1 System. Both samples A and B were formed under similar conditions recommended by Novellus as described in "Users guide to 200 mm PECVD processing for the Novellus Concept One-200 mm Dielectric System" (published by Novellus Systems, Inc., of San Jose, Calif., 1992), which is herein incorporated by reference for all purposes. Sample C is an H-R silicon nitride film deposited by PECVD in an AME 5000 system from Applied Materials of Santa Clara, Calif. under similar conditions as the PECVD Film Lots (E–H) of Example 1. Sample D is a LPCVD nitride film deposited by LPCVD under similar conditions as the LPCVD film (Lots A–D) of Example 1.

After formation of the film, the samples were heated to 720° C. Referring to FIG. 7, the hydrogen content of the samples were measured after the samples were heated to 720° C. From FIG. 4, the hydrogen content of the PECVD H-R films (sample A–C) decreased after being heated to 720° C. while the LPCVD nitride film (sample D) showed little or no change. This confirms that H-R rich layer is effective in providing hydrogen to passivate surface states.

Example 3

An experiment was conducted to analyze the relationship between SiH/(SiH+NH) and ND perimeter leakage using macros similar to those in the experiment of FIG. 5a–b. Data from the experiment are plotted in FIG. 8. As apparent from FIG. 8, lower concentrations of SiH/(SiH+NH) in the oxynitride film results in lower ND perimeter leakage. The ND leakage ranges from about 0.63 namp to about 1.72 namps for concentrations of SiH/(SiH+NH) ranging about 0–35%, respectively.

While the invention has been particularly shown and described with reference to various embodiments, it will be recognized by those skilled in the art that modifications and changes may be made to the present invention without departing from the spirit and scope thereof. Merely by way of example, the passivation layer can be used as a single film gate dielectric cap, a composite gate cap which comprises other films such as LPCVD nitride and/or various oxide films, gate conductor spacer film, as a final chip passivation material used alone or in combination with other dielectric materials, mobile ion and/or metallic contaminant barrier, or a contact etch stop. The scope of the invention should therefore be determined not with reference to the above description but with reference to the appended claims along with their full scope of equivalents.

What is claimed is:

1. A semiconductor device structure having a gate, said structure comprising:

a silicon substrate;

a dielectric layer on said substrate forming a gate dielectric;

a composite stacked gate electrode comprising a semiconductor material layer and a silicide layer on said dielectric layer;

a spacer layer adjacent to said stacked gate electrode; and a hydrogen-rich layer on said silicon substrate and gate electrode.

2. The structure of claim 1, wherein said hydrogen-rich layer comprises a hydrogen-rich silicon nitride layer.

3. The structure of claim 1, wherein said hydrogen-rich silicon nitride layer has a hydrogen content of about 5% to about 39%.

4. The structure of claim 1, wherein the hydrogen-rich layer comprises a hydrogen-rich silicon oxynitride layer.

5. The structure of claim 4, wherein said hydrogen-rich silicon oxynitride layer has a hydrogen content of about 5% to about 39%.

6. The structure of claim 1, further comprising:

a shallow trench isolation region in the silicon substrate.

7. The structure of claim 1, further comprising:

a cap silicon nitride layer on said gate electrode.

8. The structure of claim 1, wherein said doped semiconductor material comprises polysilicon.

9. The structure of claim 8, wherein said silicide comprises tungsten silicide, further comprising:

an adhesion layer over the tungsten silicide.

10. The structure of claim 9, wherein said adhesion layer comprises silicon.

11. The structure of claim 1, wherein said silicide is a material selected from the group consisting of tungsten silicide, molybdenum silicide, tantalum silicide, titanium silicide, and cobalt silicide.

* * * * *